United States Patent
Uemura et al.

(10) Patent No.: US 11,588,476 B2
(45) Date of Patent: Feb. 21, 2023

(54) AMPLITUDE MODULATION CIRCUIT AND SEMICONDUCTOR INTEGRATED CIRCUIT FOR OPTICAL COMMUNICATION SYSTEM

(71) Applicant: SUMITOMO ELECTRIC INDUSTRIES, LTD., Osaka (JP)

(72) Inventors: Hiroshi Uemura, Osaka (JP); Keiji Tanaka, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 17/522,582

(22) Filed: Nov. 9, 2021

(65) Prior Publication Data
US 2022/0149826 A1    May 12, 2022

(30) Foreign Application Priority Data
Nov. 11, 2020 (JP) .............................. JP2020-188075

(51) Int. Cl.
*H03K 5/02* (2006.01)
*H04B 10/50* (2013.01)
*H03K 17/687* (2006.01)

(52) U.S. Cl.
CPC ........... *H03K 5/02* (2013.01); *H03K 17/6871* (2013.01); *H04B 10/50* (2013.01)

(58) Field of Classification Search
CPC .............................. H03K 5/02; H03K 17/6871
See application file for complete search history.

(56) References Cited

U.S. PATENT DOCUMENTS

2016/0204753 A1* 7/2016 Uemura ............... H03G 3/3084
                                                                         330/278

FOREIGN PATENT DOCUMENTS

CA       2475520 C   * 12/2009  ............... H03F 3/19
JP       2016-131289    7/2016

* cited by examiner

*Primary Examiner* — Metasebia T Retebo
(74) *Attorney, Agent, or Firm* — Smith, Gambrell & Russell, LLP (57) ABSTRACT

An amplitude modulation circuit includes: first, second, and third input terminals; first and second output terminals; a current source; first and second transistors including a base electrically connected to the first and second input terminals, a collector electrically connected to the first and second output terminals, and an emitter electrically connected to a grounding terminal via the current source; first and second resistive elements electrically connected between the first and second output terminals and a power line; and a first MOS transistor including a drain connected to the first output terminal, a source connected to the second output terminal, and a gate connected to the third input terminal. The MOS transistor is configured to operate in a non-saturated region, and a resistance between the source and the drain of the MOS transistor is larger than resistances of the first and second resistive elements.

10 Claims, 4 Drawing Sheets

AMPLITUDE MODULATION CIRCUIT AND SEMICONDUCTOR INTEGRATED CIRCUIT FOR OPTICAL COMMUNICATION SYSTEM

CROSS-REFERENCE TO RELATED APPLICATION

This application claims priority from Japanese Patent Application No. 2020-188075, filed on Nov. 11, 2020, the entire subject matter of which is incorporated herein by reference.

TECHNICAL FIELD

The present disclosure relates to an amplitude modulation circuit and a semiconductor integrated circuit.

BACKGROUND

In optical communication systems, a communication mode in which an amplitude-modulated sub-signal is superimposed on a high-speed main signal and the resultant signal is transmitted has been used. Amplitude modulation in this communication mode is a modulation mode in which the amplitude of a main signal is modulated with a sub-signal, and an amplitude-modulated signal is generated using this modulation mode. For example, an amplifier circuit described in Japanese Unexamined Patent Publication No. 2016-131289 is known as a circuit that generates an amplitude-modulated signal.

Improvement in linearity is required for a circuit that performs amplitude modulation. When amplitude modulation is performed using a circuit with low linearity, a harmonic component of a sub-signal is superimposed on an amplitude-modulated signal and the sub-signal is not likely to be transmitted correctly. For example, when it is intended to modulate the amplitude of a main signal using a circuit with low linearity based on a sub-signal including a sinusoidal wave of a first frequency $\omega 1$ and a sinusoidal wave of a second frequency $\omega 2$, two frequency components of a frequency $(2\times\omega 1-\omega 2)$ and a frequency $(2\times\omega 2-\omega 1)$ are generated in addition to the frequencies $\omega 1$ and $\omega 2$ by third-order intermodulation distortion. When the frequency $\omega 1$ and the frequency $\omega 2$ are close to each other, the frequency components of third-order intermodulation distortion are close to the frequency $\omega 1$ and the frequency $\omega 2$ (for example, frequency components of 0.999 MHz and 1.002 MHz are generated by third-order intermodulation distortion when $\omega 1=1$ MHz and $\omega 2=1.001$ MHz). Accordingly, when amplitude modulation is performed using a circuit with low linearity, the third-order intermodulation distortion increases and a signal which should not be present may be erroneously detected by a reception side. Therefore, there is demand for an amplitude modulation circuit with high linearity that can generate an amplitude-modulated signal with reduced distortion.

SUMMARY

According to an aspect of the present disclosure, there is provided an amplitude modulation circuit including: a first input terminal; a second input terminal; a third input terminal; a first output terminal; a second output terminal; a current source; a first transistor including a control terminal, a first current terminal, and a second current terminal, the control terminal being electrically connected to the first input terminal, the first current terminal being electrically connected to the first output terminal, and the second current terminal being electrically connected to a first power line via the current source; a second transistor including a control terminal, a first current terminal, and a second current terminal, the control terminal of the second transistor being electrically connected to the second input terminal, the first current terminal of the second transistor being electrically connected to the second output terminal, and the second current terminal of the second transistor being electrically connected to the second current terminal of the first transistor and electrically connected to the first power line via the current source; a first resistive element electrically connected between the first output terminal and a second power line; a second resistive element electrically connected between the second output terminal and the second power line; and a first Metal-Oxide-Semiconductor (MOS) transistor including a first terminal, a second terminal, and a control terminal, the first terminal being connected to the first output terminal, the second terminal being connected to the second output terminal, and the control terminal being connected to the third input terminal, the first MOS transistor being configured to operate in a non-saturated region, the first MOS transistor having a resistance between the first terminal and second terminal, the resistance being larger than a resistance of the first resistive element, and the resistance being larger than a resistance of the second resistive element.

DETAILED DESCRIPTION

Hereinafter, an embodiment of the present disclosure will be described with reference to the accompanying drawings. In description with reference to the drawings, the same elements will be referred to by the same reference signs and description thereof will not be repeated.

Figure 1:
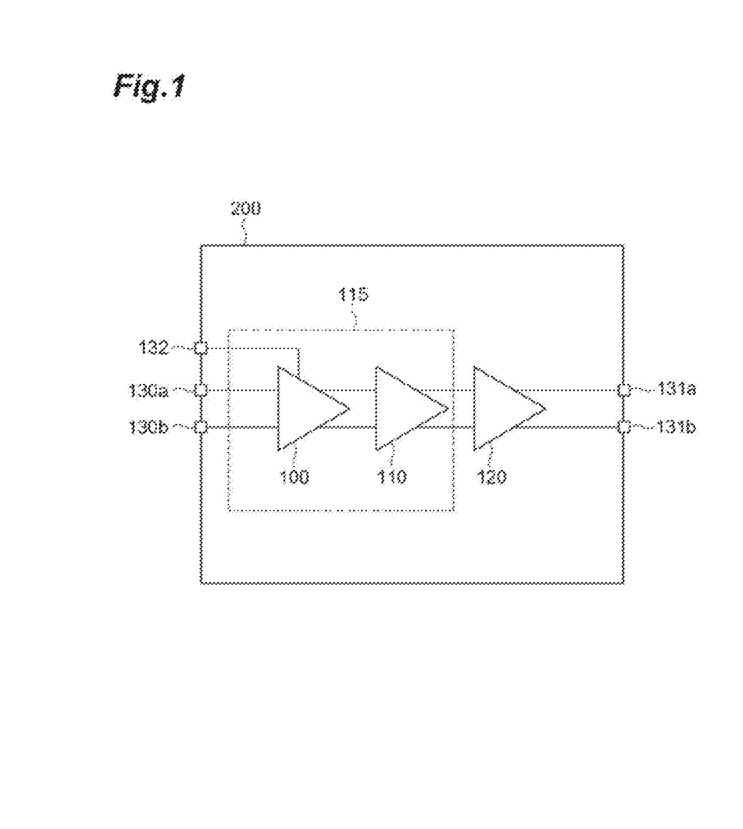
FIG. 1 is a block diagram schematically illustrating a configuration of a drive circuit 200 according to an embodiment.

FIG. 1 is a block diagram illustrating a configuration of a drive circuit 200 according to an embodiment. The drive circuit 200 is a semiconductor integrated circuit (IC) with a size of 2 mm×4 mm which is incorporated in an optical communication device such as an optical transmitter module and which is manufactured through a semiconductor process such as SiGe bipolar complementary metal oxide semiconductor (BiCMOS), and generates, amplifies, and outputs a differential signal which is an amplitude-modulated signal based on an input signal. The drive circuit 200 includes first and second input terminals 130a and 130b, a third input terminal 132, first and second output terminals 131a and 131b, an input buffer 115 including an amplitude modulation circuit 100 and an amplifier 110, and an output buffer 120.

The input terminals 130a and 130b receive, for example, a main signal which is a differential signal including two signals with the same amplitude and with inverted phases each other. The input terminal 132 receives an input of a sub-signal which is a single end signal.

The input buffer 115 generates an amplitude-modulated signal by modulating the input main signal using a sub-signal and amplifies and outputs the amplitude-modulated signal. The input buffer 115 includes an amplitude modulation circuit 100 and an amplifier (an amplifier circuit) 110 connected to the amplitude modulation circuit 100 in a cascade manner. The amplitude modulation circuit 100 generates an amplitude-modulated signal. The amplifier 110 amplifies the amplitude-modulated signal output from the amplitude modulation circuit 100 and outputs the amplified signal to the output buffer 120. The output buffer (amplifier circuit) 120 is connected to the input buffer 115 in a cascade manner, amplifies an output signal output from the amplifier 110, and outputs the amplified output signal (differential signal) from the output terminals 131a and 131b.

Here, since an output amplitude of the amplitude modulation circuit 100 is preferably smaller to realize a linear operation as will be described later, it is preferable that the amplitude modulation circuit 100 be provided in the input buffer 115. In other words, when a plurality of stages of amplifiers are provided in the input buffer 115 as in this embodiment, the amplitude modulation circuit 100 is preferably provided in a stage closer to the input terminals 130a and 130b in the input buffer 115. Accordingly, it is possible to perform amplitude modulation on a main signal before it is amplified and to decrease an output amplitude of the amplitude modulation circuit 100. As a result, it is possible to enlarge a linear operation range for amplitude modulation in the drive circuit 200.

The circuit configuration of the drive circuit 200 may be appropriately modified, the amplifier 110 may be omitted, or another amplifier may be additionally provided. Various other circuits may be added to paths other than a transmission path for a main signal. The invention is not limited to a configuration in which the number of signal transmission paths (channels) is one, and a configuration in which a plurality of channels (for example, four channels) are arranged in parallel is also possible.

The configuration of the amplitude modulation circuit 100 according to this embodiment will be described below with reference to FIGS. 2, 3A, 3B, and 3C.

Figure 2:
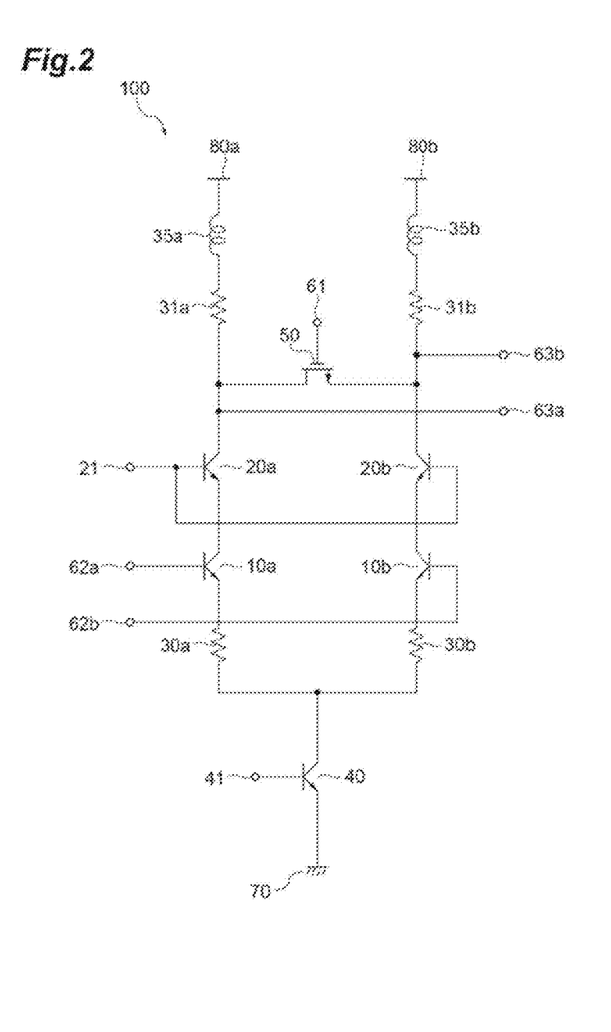
FIG. 2 is a circuit diagram illustrating a configuration of an amplitude modulation circuit 100 illustrated in FIG. 1.

FIG. 2 is a circuit diagram illustrating the configuration of the amplitude modulation circuit 100 illustrated in FIG. 1. The amplitude modulation circuit 100 is a differential amplifier circuit that modulates the amplitude of a main signal, which is a differential signal, using an input sub-signal and generates an amplitude-modulated signal, which is a differential signal, and is an integrated circuit which is formed on a Si substrate, for example, using a semiconductor process such as SiGe BiCMOS. A maximum supply voltage of the integrated circuit in which the amplitude modulation circuit 100 is mounted is, for example, 3.3 V. The main signal input to the amplitude modulation circuit 100 is, for example, a 32QAM signal with 32 signal points which is obtained by quadrature amplitude modulation (QAM), a modulation rate of the signal is 100 GBaud, and a maximum amplitude of the signal is 200 mV differentially. The sub-signal input to the amplitude modulation circuit 100 is, for example, a synthesized wave of a sinusoidal wave with a frequency of 1 MHz and an amplitude of 100 mV and a sinusoidal wave with a frequency of 1.001 MHz and an amplitude of 100 mV, and has a beat of a frequency difference (for example, 1 kHz) between the two sinusoidal waves. The main signal includes, for example, a frequency component of 50 GHz or higher as will be described later and a signal rate of the sub-signal is lower than a signal rate of the main signal. Accordingly, in the amplitude-modulated signal which is output, the sub-signal is observed as an envelope curve of the main signal. The average amplitude of the amplitude-modulated signal (a difference between average values of an upper envelope curve and a lower envelope curve) is, for example, 200 mV differentially. Substitutionally, a carrier wave (carrier) with a constant frequency can be used as the main signal and a data signal (a baseband signal) can be used as the sub-signal.

Figure 3A:
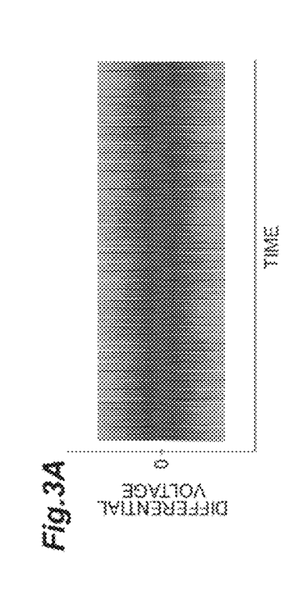
FIG. 3A is a graph illustrating a waveform of a signal which is processed by the amplitude modulation circuit 100 illustrated in FIG. 1.
Figure 3B:
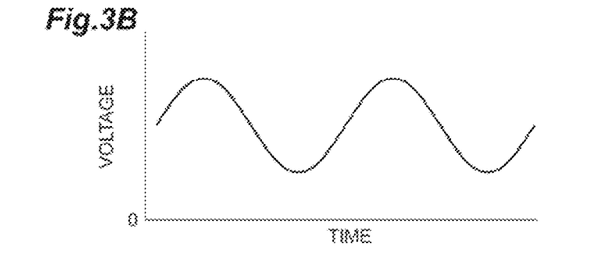
FIG. 3B is a graph illustrating a waveform of a signal which is processed by the amplitude modulation circuit 100 illustrated in FIG. 1.
Figure 3C:
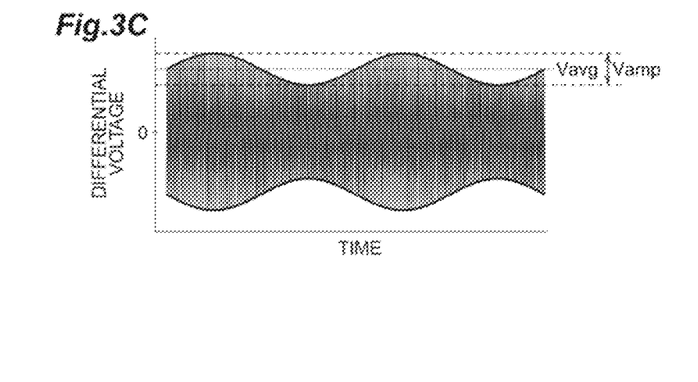
FIG. 3C is a graph illustrating a waveform of a signal which is processed by the amplitude modulation circuit 100 illustrated in FIG. 1.

FIGS. 3A to 3C illustrate exemplary waveforms of the signals processed by the amplitude modulation circuit 100. FIG. 3A illustrates a waveform of the main signal, FIG. 3B illustrates a waveform of the sub-signal, and FIG. 3C illustrates a waveform of the amplitude-modulated signal. The scales of time in FIGS. 3A to 3C are set to be the same. Since the signal rate of the main signal is higher than the signal rate of the sub-signal by a factor of 1000 or more as will be described later, the main signal is illustrated in a band shape in FIG. 3A. In this way, the amplitude-modulated signal has a waveform obtained by modulating the amplitude of the main signal using the sub-signal. In the amplitude-modulated signal, the sub-signal superimposed on the main signal is observed as an envelope curve of the main signal. Here, when an average value of voltages of one envelope curve in the amplitude-modulated signal is Vavg and a voltage amplitude of the envelope curve is Vamp, a degree of modulation of amplitude modulation of the main signal using the sub-signal is defined as Vamp/Vavg. In an example of a waveform of the amplitude-modulated signal in this embodiment, Vavg=100 mV, Vamp=10 mV, and the degree of modulation is 0.1 (10%). Substitutionally, the average amplitude of the main signal is 2×Vavg and the degree of modulation of amplitude modulation may be defined as a ratio Vamp/(2Vavg) of the amplitude of the sub-signal to the average amplitude of the main signal. According to this definition, the degree of modulation in this example is 0.05 (5%).

It is preferable that a Nyquist frequency of the main signal (a frequency corresponding to a one-half of the modulation rate, which is 50 GHz in this embodiment) be higher than the frequency of the sub-signal (1 MHz or 1.001 MHz in this embodiment) by a factor of 1000 or more. In this case, the upper envelope curve and the lower envelope curve of the main signal have an almost straight line shape in a time range of about a period of the sub-signal. As a result, the main signal can be substantially considered as a signal with a fixed amplitude and the envelope curve (the sub-signal) of the amplitude-modulated signal is less likely to be affected by the waveform of the main signal.

Referring back to FIG. 2, the amplitude modulation circuit 100 includes bipolar transistors 10a, 10b, 20a, 20b, and 40, resistive elements 30a, 30b, 31a, and 31b, inductors 35a and 35b, a metal-oxide semiconductor (MOS) transistor (first MOS transistor) 50, an input terminal (a third input terminal) 61 to which a sub-signal is input, input terminals (first and second input terminals) 62a and 62b to which a main signal is input, output terminals (first and second output terminals) 63a and 63b from which an amplitude-modulated signal is output, a grounding line 70, bias supply terminals 21 and 41, and power lines 80a and 80b.

Elements constituting the amplitude modulation circuit 100 will be described below.

In the bipolar transistors (first and second transistors) 10a and 10b, the bases (control terminals) are respectively connected to the input terminals 62a and 62b, the collectors (one current terminals) are respectively connected to the emitters of the bipolar transistors 20a and 20b, and the emitters (the other current terminals) are respectively connected to ends on one side of the resistive elements 30a and 30b. The bipolar transistors 10a and 10b change a collector current according to the main signal. The bipolar transistors 10a and 10b may be, for example, NPN type heterojunction bipolar transistors (HBT). The bipolar transistors 10a and 10b may be replaced with, for example, n-type MOS transistors. In this case, in such MOS transistors, the gate serves as the control terminal, the drain serves as one current terminal, and the source serves as the other current terminal One current terminal is a terminal via which a current controlled by the control terminal flows into the transistor, and the other current terminal is a terminal via which a current controlled by the control terminal flows out from the transistor.

In each of the resistive elements 30a and 30b, one end is connected to the emitter of the corresponding bipolar transistor 10a or 10b and the other end is connected to the collector of the bipolar transistor 40. The resistive elements 30a and 30b are degeneration resistors and enable enlargement of a linear input range of the amplitude modulation circuit 100. The resistive elements 30a and 30b are, for example, n-type poly-Si resistors. When the linear input range of the amplitude modulation circuit 100 is sufficiently broader than a range of use, the resistive elements 30a and 30b may be omitted. Accordingly, the bipolar transistor 20a and 20b may be coupled (electrically connected) to the grounding line 70 via the resistive elements 30a and 30b, respectively. The bipolar transistor 20a and 20b may be directly connected to the grounding line 70.

In each of the bipolar transistors 20a and 20b, the base is connected to the bias supply terminal 21, the emitter is connected to the collector of the corresponding bipolar transistor 10a or 10b, and the collector is connected to the corresponding output terminals 63a or 63b. The bipolar transistors 20a and 20b are cascode transistors. For example, a DC voltage is applied to the bases of the bipolar transistors 20a and 20b via the bias supply terminal 21. With this configuration, since the voltage amplitude at the collectors of the bipolar transistors 10a and 10b is curbed and a mirror effect of respective capacitances between the base and the collector of the bipolar transistors 10a and 10b is curbed, operation bandwidth of the amplitude modulation circuit 100 can be widened. Since output resistances of the amplitude modulation circuit 100 increases due to presence of the bipolar transistors 20a and 20b, a voltage gain of the amplitude modulation circuit 100 can be enhanced. The bipolar transistors 20a and 20b may be replaced with, for example, n-type MOS transistors. When the operation bandwidth of the amplitude modulation circuit 100 is sufficiently broad, the bipolar transistors 20a and 20b may be omitted. Accordingly, the collectors of the bipolar transistors 10a and 10b are coupled (electrically connected) to the output terminals 63a and 63b via the bipolar transistors 20a and 20b, respectively. The bipolar transistors 20a and 20b may be omitted, so that the collectors of the bipolar transistors 10a and 10b are directly connected to the output terminals 63a and 63b, respectively.

In each of the resistive elements (first and second resistive elements) 31a and 31b, one end is connected to the corresponding output terminal 63a or 63b and the other end is coupled (electrically connected) to the corresponding power line 80a or 80b with a second source potential (for example, 3.3 V) via the inductors 35a or 35b. The resistive elements 31a and 31b are load elements of the amplitude modulation circuit 100. For example, n-type poly-Si resistors can be used as the resistive elements 31a and 31b and resistances thereof are 60Ω.

The inductors 35a and 35b are respectively connected between the resistive elements 31a and 31b and the power lines 80a and 80b and are load elements of the amplitude modulation circuit 100. With these elements, a high-frequency gain of the amplitude modulation circuit 100 can be enhanced and an operation bandwidth thereof can be broadened. Spiral inductors in which a wire is formed in a spiral shape can be used as the inductors 35a and 35b. Connection positions of the resistive elements 31a and 31b and the inductors 35a and 35b may be exchanged. When the operation bandwidth of the amplitude modulation circuit 100 is sufficiently broader than the range of use, the inductors 35a and 35b may be omitted. Accordingly, the resistive elements 31a and 31b may be directly connected to the power lines 80a and 80b, respectively.

In the bipolar transistor 40, the collector thereof is connected to the other ends of the resistive elements 30a and 30b, the base thereof is connected to the bias supply terminal 41, and the emitter thereof is connected to the grounding line 70 with a ground potential (a first source potential) of 0 V. The bipolar transistor 40 serves as a current source. A current based on the voltage of the bias supply terminal 41 is generated by the bipolar transistor 40 and a current value thereof is, for example, 8 mA. A base voltage of another bipolar transistor which is diode-connected may be applied to the bias supply terminal 41. In this case, a current mirror is constructed and an amount of current generated by the bipolar transistor 40 can be easily adjusted. A MOS transistor may be used instead of the bipolar transistor 40. A circuit including a resistive element or a resistive element and an inductor may be used instead of the bipolar transistor 40.

The MOS transistor (first MOS transistor) 50 is an n-type MOS transistor of which the drain (first terminal) is connected to the output terminal 63a, the source (second terminal) is connected to the output terminal 63b, and the gate (control terminal) is connected to the input terminal 61.

For example, the MOS transistor 50 is used as a variable resistive element. In the MOS transistor 50, a current flows from the drain to the source when the potential of the drain is higher than the potential of the source, and a current flows from the source to the drain when the potential of the drain is lower than the potential of the source. Since a current flows in two directions between the drain and the source in this way, the drain and the source of the MOS transistor 50 preferably have symmetry. Symmetry represents that electrical characteristics before exchange and electrical characteristics after exchange are substantially the same when the drain and the source are exchanged. Being substantially the same means that the two electrical characteristics may differ in an allowable range. Since the MOS transistor 50 is used as a variable resistive element, the drain (one current terminal) may be connected to the output terminal 63b and the source (the other current terminal) may be connected to the output terminal 63a. By using an n-type MOS transistor having higher mobility than a p-type MOS transistor as the MOS transistor 50, the MOS transistor 50 can be decreased in size to realize the same degree of modulation.

Accordingly, since the capacitance of the MOS transistor 50 decreases, the operation bandwidth of the amplitude modulation circuit 100 can be broadened. Here, when an n-type MOS transistor is used as the MOS transistor 50, a drain-source resistance decreases with an increase of the gate voltage and thus the amplitude of the envelope curve of the amplitude-modulated signal decreases. That is, the amplitude modulation circuit 100 has an inverting amplification function. On the other hand, when a p-type MOS transistor is used as the MOS transistor 50, the amplitude of the envelope curve of the amplitude-modulated signal increases with an increase of the gate voltage and thus the amplitude modulation circuit 100 has a non-inverting amplification function. The MOS transistor 50 may include a plurality of MOS transistors.

The amplitude modulation circuit 100 having the aforementioned configuration is set to satisfy the three following conditions to realize a linear operation.

The first condition is a condition that the MOS transistor 50 is set to operate in a non-saturated region (a triode region). This condition is expressed by the following expression in this embodiment in which an n-type MOS transistor is used as the MOS transistor 50, where the drain-source voltage of the MOS transistor 50 is Vds, the gate-source voltage is Vgs, the gate-drain voltage is Vgd, and a threshold voltage is Vth.

$$|V_{ds}| < \max\{V_{gs}, V_{gd}\} - V_{th} \quad (1)$$

In Expression (1), max{Vgs, Vgd} represents the higher value of the voltage Vgs and the voltage Vgd. In this embodiment, since a symmetric structure in which the MOS transistor 50 is connected between the output terminals of a differential amplifier is constructed, an operation region of the MOS transistor 50 is determined as a result of comparison between the higher value of the voltage Vgs and the voltage Vgd and the absolute value of the voltage Vds.

Here, an region in which the voltage Vds is equal to or higher than 0 is considered for the purpose of simplification of calculation. Since the amplitude modulation circuit 100 has a configuration for amplifying a differential signal using a symmetric circuit, the same conclusion is obtained even when the voltage Vds is equal to or lower than 0. When the voltage Vds is equal to or higher than 0, Expression (1) can be expressed as follows.

$$V_{ds} < V_{gs} - V_{th} \quad (1)'$$

In a numerical example of this embodiment, the maximum amplitude of the amplitude-modulated signal is Vavg+Vamp/2=105 mV and the maximum amplitude of the sub-signal (a synthesized wave of waves with the amplitude of 100 mV and with different frequencies) is 200 mV. In this case, for example, when the threshold voltage is Vth=250 mV, the condition of Expression (1)' can be rewritten as a relation of 105 mV<(Vg−200 mV/2)−(Vs−105 mV/2)−250 mV, where Vg denotes the gate voltage and Vs denotes the source voltage. From this relation, the condition of Expression (1)' is satisfied when a DC bias voltage of the voltage Vgs is equal to or higher than 402.5 mV.

The second condition is a condition that the drain-source resistance of the MOS transistor 50 is sufficiently larger than the resistances of the resistive elements 31a and 31b. This condition is expressed by the following expression, where the drain-source resistance of the MOS transistor 50 is Rmos and the resistances of the resistive elements 31a and 31b are Rload.

$$R_{mos} >> R_{load} \quad (2)$$

In this embodiment, Rload=60Ω. In order to satisfy the following approximation, it is preferable that the resistance Rmos be ten times the resistance Rload or larger. In this embodiment, since Rload=60Ω, Rmos should be equal to or larger than 600Ω.

The third condition is a condition that a change ΔVds of the drain-source voltage (that is, an amplitude change of two envelope curves of the amplitude-modulated signal) is sufficiently smaller than a change ΔVgs of the gate voltage (the amplitude of the sub-signal) when the gate voltage of the MOS transistor 50 is changed by the sub-signal. That is, the change ΔVds of the drain-source voltage of the MOS transistor 50 which is caused by the sub-signal is smaller than the change ΔVgs of the gate voltage of the MOS transistor 50 which is caused by the sub-signal. This condition is expressed by the following expression.

$$\left|\frac{\Delta V_{ds}}{\Delta V_{gs}}\right| << 1 \quad (3)$$

In order to satisfy the following approximation, it is preferable that the value of the left side of Expression (3) be equal to or less than ⅕. In this embodiment, since ΔVds=2×Vamp=20 mV and ΔVgs=200 mV, ΔVds/ΔVgs=0.1 satisfies this condition. The voltage change ΔVds is a voltage change due to the voltage change ΔVgs but is not a voltage change due to an amplitude change of the main signal.

In order to satisfy the third condition, Expression (3) can be satisfied, for example, by adjusting a gate width and a gate length of the MOS transistor 50 and the resistances of the resistive elements 31a and 31b.

A load resistance of the amplitude modulation circuit 100 when the three conditions are satisfied will be evaluated.

First, a drain-source resistance of the MOS transistor 50 is calculated. A drain current Id of the MOS transistor 50 is expressed by the following expression when Expression (1)' is satisfied.

$$I_d = \beta(V_{gs} - V_{th} - \tfrac{1}{2}V_{ds})V_{ds} \quad (4)$$

In Expression (4), β is expressed by the following expression using a mobility μ a capacitance per unit area Cox of a gate oxide film, a gate width W, and a gate length L.

$$\beta = \frac{1}{2}\mu C_{ox}\frac{W}{L} \quad (5)$$

The drain-source resistance Rmos of the MOS transistor 50 is calculated from Expression (4) using the following expression.

$$R_{mos} = \left(\frac{dI_d}{dV_{ds}}\right)^{-1} = \frac{1}{\beta\left(V_{gs} - V_{th} - \frac{1}{2}V_{ds}\right)} \quad (6)$$

Here, the following relation of Expression (7) which is acquired based on the fact that $\Delta V_{ds}=\Delta V_d-\Delta V_s=-2\Delta V_s$ and $\Delta V_{gs}=\Delta V_g-\Delta V_s$ are satisfied and the gate voltage is independent of the drain-source voltage is used.

$$\frac{dV_{gs}}{dV_{ds}} = \frac{1}{2} \qquad (7)$$

Then, the voltage gain of the amplitude modulation circuit 100 is calculated. When Expression (2) is satisfied, the load resistance Rsum in the differential operation of the amplitude modulation circuit is approximated as follows.

$$R_{sum} = \frac{2R_{load} \cdot R_{mos}}{2R_{load} + R_{mos}} \cong 2R_{load}\left(1 - \frac{2R_{load}}{R_{mos}}\right) \qquad (8)$$

By substituting Expression (6) into Expression (8), the load resistance Rsum of the amplitude modulation circuit 100 is calculated according to the following expression.

$$R_{sum}=2R_{load}\{1-2R_{load}\cdot\beta(V_{gs}-V_{th}-\tfrac{1}{2}V_{ds})\} \qquad (9)$$

By differentiating Expression (9) with respect to the voltage Vgs, the following expression is derived.

$$\frac{dR_{sum}}{dV_{gs}} = -4R_{load}^2\beta\left\{1-\frac{1}{2}\frac{dV_{ds}}{dV_{gs}}\right\} \qquad (10)$$

Expression (10) is approximated as follows based on the relation of Expression (3).

$$\frac{dR_{sum}}{dV_{gs}} \cong -4R_{load}^2\beta \qquad (11)$$

Since Expression (11) represents a constant, the load resistance Rsum of the amplitude modulation circuit 100 changes linearly with respect to the voltage Vgs. Since the voltage gain of the amplitude modulation circuit 100 is proportional to the load resistance Rsum, the following relation is derived where the input voltage of the amplitude modulation circuit 100 is Vin and the output voltage thereof is Vout.

$$V_{out}=(kV_{gs}+C)V_{in} \qquad (12)$$

In this expression, k and C are constants, Vin is a main signal, Vgs is a sub-signal, and Vout is an amplitude-modulated signal. It can be seen from Expression (12) that the voltage gain (kVgs+C) of the amplitude modulation circuit 100 is proportional to the sub-signal Vgs and a harmonic component is not included therein, and it can also be seen that amplitude modulation with excellent linearity is realized by the amplitude modulation circuit 100.

Figure 4:
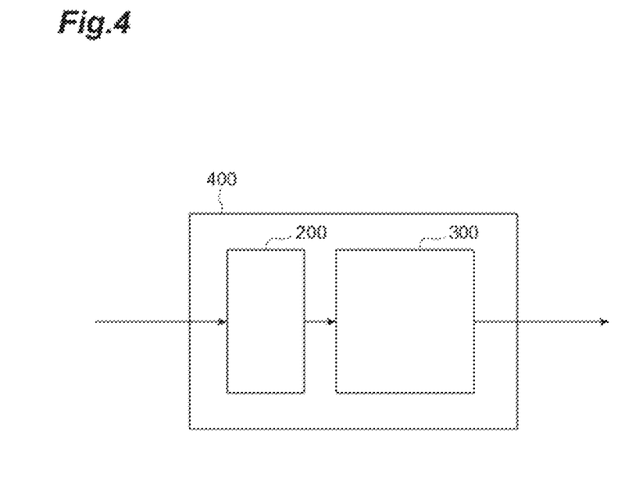
FIG. 4 is a block diagram illustrating a configuration of an optical transmitter module 400 according to the embodiment.

FIG. 4 illustrates a configuration of an optical transmitter module 400 according to this embodiment. The optical transmitter module 400 includes the drive circuit 200 and an optical modulation device 300. For example, the drive circuit 200 amplitude-modulates, amplifies, and outputs four input differential signals, and the optical modulation device 300 generates optical signals which are modulated based on the four differential signals output from the drive circuit 200 and outputs, for example, one optical signal subjected to optical polarization division multiplexing QAM modulation.

As a variation, the optical modulation device 300 may generate four optical signals with different peak wavelengths based on the four differential signals. For example, the optical modulation device 300 outputs four optical signals subjected to PAM modulation. In this case, the optical transmitter module 400 may further include an optical multiplexer and generate and output one wavelength division multiplexed signal by multiplexing the four optical signals using the optical multiplexer. The optical transmitter module 400 is, for example, an optical module in which the drive circuit 200 and the optical modulation device 300 are integrated and mounted on a ceramic package and the outer size thereof is, for example, 30 mm×15 mm×5 mm. With the optical transmitter module 400 having this configuration, since the drive circuit 200 in which the amplitude modulation circuit 100 is mounted is used, it is possible to realize an optical transmitter module with low power consumption and with a small area which can perform amplitude modulation with excellent linearity in a broad operation bandwidth.

Figure 5:
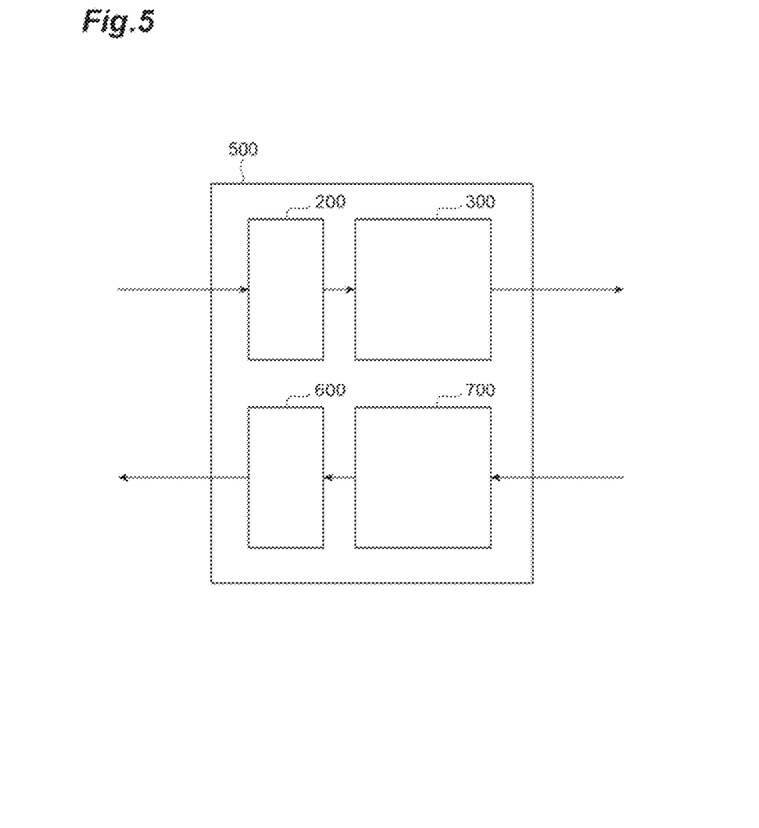
FIG. 5 is a block diagram illustrating a configuration of an optical transceiver module 500 according to the embodiment.

FIG. 5 illustrates a configuration of an optical transceiver module 500 according to this embodiment. The optical transceiver module 500 includes a reception circuit 600 and a light receiving device 700 in addition to the drive circuit 200 and the optical modulation device 300. The light receiving device 700 receives an optical signal which is externally input via an optical transmission line, for example, separates four signals (photocurrents) from the optical polarization division multiplexing QAM-modulated optical signal, and outputs the four signals. The reception circuit 600 converts the four photocurrents to voltages, and amplifies and outputs the converted voltages. It is also conceivable that the optical transceiver module 500 may transmit and receive a wavelength division multiplexed signal in which four optical signals with different peak wavelengths are synthesized as described above. With the optical transceiver module 500 having this configuration, since the drive circuit 200 in which the amplitude modulation circuit 100 is mounted is used, it is possible to realize an optical transceiver module with low power consumption and with a small area which can perform amplitude modulation with excellent linearity in a broad operation bandwidth.

With the aforementioned amplitude modulation circuit 100 according to this embodiment, since the collector currents of the bipolar transistors 10a and 10b are modulated using a main signal, a differential signal is output from the output terminals 63a and 63b. The resistance of the MOS transistor 50 between the collector of the bipolar transistor 10a and the collector of the bipolar transistor 10b increases or decreases in accordance with a sub-signal and thus the differential signal is modulated using the sub-signal and output as an amplitude-modulated signal from the output terminal 63a and 63b. Here, since the MOS transistor 50 operates in a non-saturated region and the source-drain resistance of the MOS transistor 50 is configured to be larger than the resistances of the resistive elements 31a and 31b which are load resistances, the voltage gain of the amplitude modulation circuit 100 is proportional to the sub-signal. As a result, it is possible to realize amplitude modulation with excellent linearity and to generate an amplitude-modulated signal with reduced distortion.

In this embodiment, since amplitude modulation can be performed using only the MOS transistor connected between the output terminals of the differential amplifier, it is possible to decrease power consumption and to decrease a circuit area. Since a MOS transistor has a smaller parasitic capacitance than a bipolar transistor, for example, it is possible to widen the operation bandwidth in comparison with a case in which a Gilbert cell is used. That is, according to this embodiment, it is possible to provide an amplitude modulation circuit of broad operation bandwidth with low power consumption and with a small area that can perform amplitude modulation with excellent linearity.

In the amplitude modulation circuit 100 according to this embodiment, when a sub-signal is input, the change of the drain-source voltage of the MOS transistor 50 is less than the change of the gate voltage of the MOS transistor 50 and is equal to or less than one-fifth of the gate voltage. With this configuration, it is possible to more stably maintain the linear operation of the amplitude modulation circuit 100.

In this embodiment, a Nyquist frequency of a main signal is equal to or greater than 1000 times the frequency of the sub-signal. With this setting, an envelope curve of an amplitude-modulated signal is less likely to be affected by the waveform of the main signal and the reception side can easily demodulate the sub-signal.

With the drive circuit 200 according to this embodiment, since the amplitude modulation circuit 100 is incorporated therein, it is possible to provide a circuit of broad operation bandwidth with low power consumption and with a small area that can perform amplitude modulation with excellent linearity. Particularly, since the amplitude modulation circuit 100 is provided in the input buffer 115, it is possible to enlarge a linear operation range in amplitude modulation of the drive circuit 200.

While the principles of the present disclosure have been illustrated and described above in preferable embodiments, it will be recognized by those skilled in the art that the present disclosure can be modified in arrangement and details without departing from the principles. The present disclosure is not limited to specific configurations disclosed in the embodiments. Therefore, the rights are claimed on all the modifications and changes derived from the claims and the scope of the spirit thereof.

Figure 6:
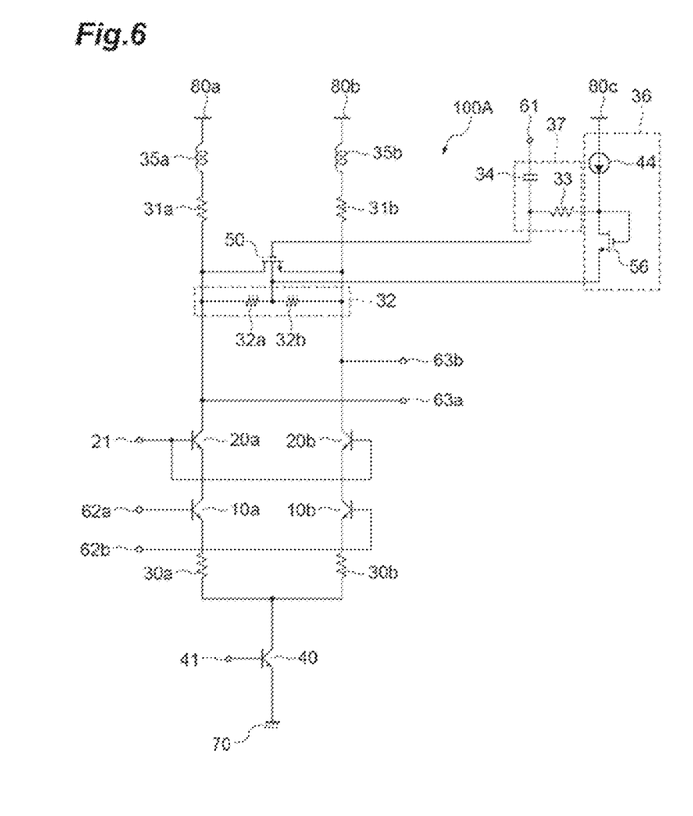
FIG. 6 is a circuit diagram illustrating a configuration of an amplitude modulation circuit 100A according to a modified example.

FIG. 6 illustrates a configuration of an amplitude modulation circuit 100A according to a modified example. The configuration of the amplitude modulation circuit 100A is different from the aforementioned embodiment in that a circuit generating a bias voltage which is applied to the gate of the MOS transistor 50 is added.

That is, an intermediate potential generator circuit 32 which is a series resistor circuit including resistive elements 32a and 32b, a bias voltage generator circuit 36 that generates a bias voltage based on an intermediate potential and includes a MOS transistor (second MOS transistor) 56 and a current source 44, and a superimposition circuit 37 that superimposes an AC component of the sub-signal on the bias voltage and includes a capacitor 34 and a resistive element 33 are additionally provided in the amplitude modulation circuit 100A.

The resistive elements 32a and 32b are connected in series between the output terminals 63a and 63b for an amplitude-modulated signal, an output of the series resistor circuit which is a connection point therebetween is connected to a back gate of the MOS transistor 50, and an intermediate potential of the amplitude-modulated signal at the connection point is generated and applied to the back gate of the MOS transistor 50. It is preferable that the resistive elements 32a and 32b have a resistance equal to or greater than ten times that of the resistive elements 31a and 31b such that the load resistance of the amplitude modulation circuit 100A does not decrease. The resistances of the resistive elements 32a and 32b are preferably substantially the same.

The MOS transistor 56 is a diode-connected MOS transistor of which the source (first terminal) is connected to the output of the series resistor circuit, and the gate (control terminal) and the drain (second terminal) are connected to one end of the current source 44. It is preferable that the MOS transistor 56 be the same type of transistor as the MOS transistor 50, that is, an n-type MOS transistor. For example, the MOS transistor 56 may have substantially the same electrical characteristics as the MOS transistor 50.

One end of the current source 44 is connected to the drain and the gate of the MOS transistor 56 and the other end is connected to a power line 80c with a third source potential (for example, 3.3 V). The current source 44 generates a current which flows to the bipolar transistor 40 via the MOS transistor 56 and the resistive elements 32a and 32b. Accordingly, a bias voltage based on a common-mode voltage of the amplitude-modulated signal is generated in the drain of the MOS transistor 56. The current source 44 is, for example, a current mirror circuit constituted by MOS transistors.

The superimposition circuit 37 including a resistive element 33 and a capacitor 34 constitutes a high-pass filter. Specifically, the capacitor 34 is connected between the input terminal 61 and the gate of the MOS transistor 50, and the resistive element 33 is connected between the output of the bias voltage generator circuit 36 and the gate of the MOS transistor 50. Accordingly, an AC component of a sub-signal input from the input terminal 61 is superimposed on a bias voltage generated in the drain of the MOS transistor 56, and a bias voltage on which the AC component has been superimposed is applied to the gate of the MOS transistor 50. A cutoff frequency of the high-pass filter is calculated as $1/(2\pi RC)$, where a resistance of the resistive element 33 is defined as R and a capacitance of the capacitor 34 is defined as C. For example, a Metal-Insulator-Metal (MIM) capacitor which is formed on a semiconductor chip can be used as the capacitor 34.

With the amplitude modulation circuit 100A according to this modified example, a bias voltage based on a common-mode voltage of an amplitude-modulated signal is generated and a signal in which an AC component of a sub-signal is superimposed on the bias voltage is applied to the gate of the MOS transistor 50. Accordingly, it is possible to stably maintain a linear operation of the amplitude modulation circuit 100A. That is, it is possible to absorb a variation of a threshold value of the MOS transistor 50 due to a temperature fluctuation, a process variation, or the like. For example, the threshold voltage of the MOS transistor 50 may depart from a standard value due to a temperature fluctuation or a process variation. In this case, an optimal bias voltage (a DC gate voltage of the MOS transistor 50) at which the amplitude modulation circuit 100A can operate linearly also varies. In this modified example, since the bias voltage is generated using the diode-connected MOS transistor 56, it is possible to absorb (compensate for) a variation of the threshold voltage. Accordingly, it is possible to stably maintain the linear operation of the amplitude modulation circuit 100A.

In this modified example, the output of the series resistor circuit that generates an intermediate potential is connected to the back gate. With this circuit configuration, since a common-mode voltage of an amplitude-modulated signal can be applied to the back gate of the MOS transistor 50 and a substrate bias effect of the MOS transistor 50 can be curbed, it is possible to more stably absorb (compensate for) a threshold variation of the MOS transistor 50. Selectively, the output of the series resistor circuit that generates an intermediate potential may not be connected to the back gate.

Figure 7:
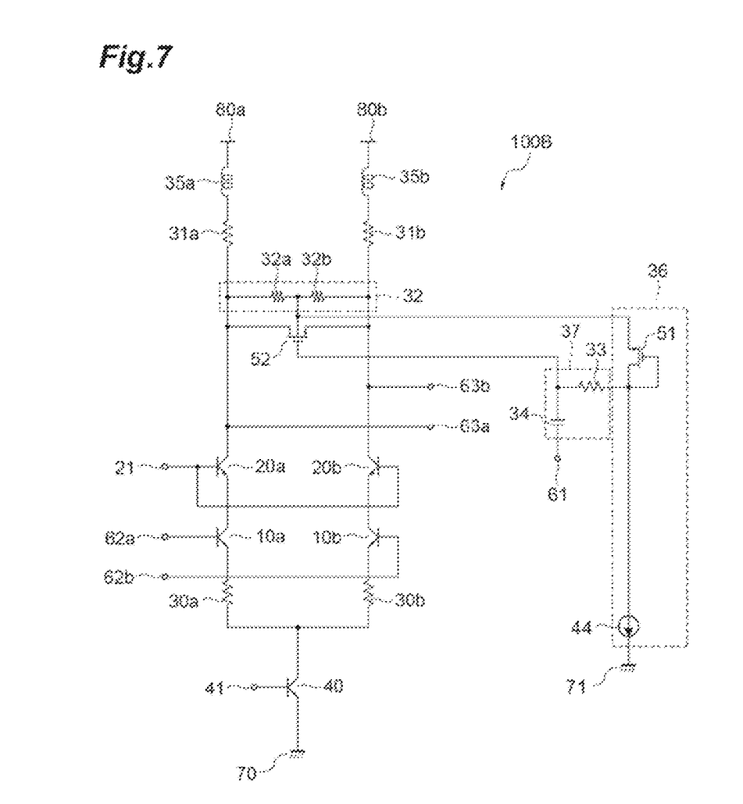
FIG. 7 is a circuit diagram illustrating a configuration of an amplitude modulation circuit 100B according to a modified example.

FIG. 7 illustrates a configuration of an amplitude modulation circuit 100B according to another modified example. The configuration of the amplitude modulation circuit 100B is different from that of the modified example illustrated in FIG. 6, in that a p-type MOS transistor is used as a MOS transistor 52 and a MOS transistor (second MOS transistor) 51 which is a p-type MOS transistor is accordingly used instead of the MOS transistor 56. The current source 44 is connected between the drain and the gate of the MOS transistor 51 and a grounding line 71 with a ground potential and generates a current flowing from the power lines 80a and 80b via the resistive elements 32a and 32b and the MOS transistor 51.

In order to allow the MOS transistor 52 to operate in a non-saturated region (a triode region), a condition represented by Expression (13) should be satisfied. Here, the drain-source voltage of the MOS transistor 52 is defined as Vds, the gate-source voltage thereof is defined as Vgs, the gate-drain voltage thereof is defined as Vgd, and the threshold voltage is defined as Vth.

$$|V_{ds}| < \max\{|V_{gs}|, |V_{gd}|\} - V_{th} \quad (13)$$

With the amplitude modulation circuit 100B having the aforementioned configuration, a bias voltage based on a common-mode voltage of an amplitude-modulated signal is also generated and a signal in which an AC component of a sub-signal is superimposed on the bias voltage is applied to the gate of the MOS transistor 52. Accordingly, it is possible to stably maintain a linear operation of the amplitude modulation circuit 100B.

Figure 8:
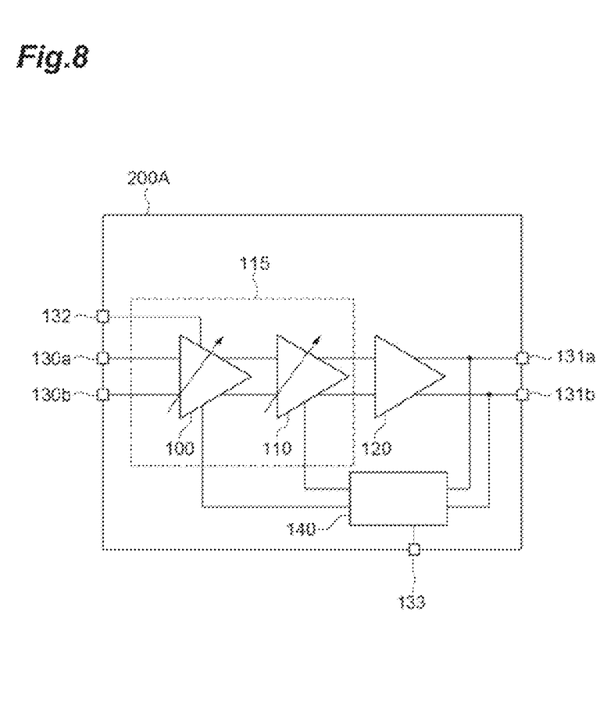
FIG. 8 is a circuit diagram illustrating a configuration of a drive circuit 200A according to a modified example.

FIG. 8 illustrates a configuration of a drive circuit 200A according to a modified example. The configuration of the drive circuit 200A is different from the configuration of the drive circuit 200 in that an automatic gain control circuit 140 that realizes an automatic gain control function is provided.

The automatic gain control circuit 140 is connected between the input terminals 130a and 130b and the output terminals 131a and 131b and includes a control terminal 133 for gain adjustment. The automatic gain control circuit 140 detects the amplitude of an amplitude-modulated signal amplified by the input buffer 115 and the output buffer 120 and generates a feedback signal for adjusting the gain of the amplitude modulation circuit 100 and the amplifier 110 based on the detection result. The amplitude modulation circuit 100 and the amplifier 110 receives the feedback signal and adjusts the gain based on the feedback signal.

An example of a configuration for gain adjustment in the amplitude modulation circuit 100 is a configuration in which the resistive elements 30a and 30b are provided as variable resistors. Alternatively, an example thereof is a configuration in which a MOS transistor is provided between the emitters of the bipolar transistors 10a and 10b. With this configuration, the drain-source resistance of the MOS transistor can be changed by operating such that the gate voltage of the MOS transistor changes, and thus the gain of the amplitude modulation circuit 100 can be adjusted.

In the aforementioned modified example, for example, an amplitude setting voltage (a DC voltage) is applied to the control terminal 133 and the magnitude of an output amplitude of the drive circuit 200A can be set based on the magnitude of the amplitude setting voltage. For example, even when the amplitude of a main signal input to the drive circuit 200A changes, the output amplitude of the drive circuit 200A can be made constant by detecting a signal amplitude at the output terminals 131a and 131b and automatically adjusting the magnitude of the feedback signal through comparison with the amplitude setting voltage.

With the drive circuit 200A according to the modified example, it is possible to make the magnitude of the output amplitude constant even when the input amplitude of the drive circuit 200A changes. Accordingly, since the output amplitude of the amplitude modulation circuit 100 can be suppressed as being small, it is possible to enlarge the linear operation range of amplitude modulation in the amplitude modulation circuit 100 and to improve stability of the linear operation.

The position at which the signal gain is detected by the automatic gain control circuit 140 can be appropriately changed. For example, the automatic gain control circuit 140 may be configured to detect the output amplitude at the output terminals 63a and 63b of the amplitude modulation circuit 100 and to adjust the gain of the amplitude modulation circuit 100 based on the detection result. Accordingly, it is possible to directly control the output amplitude of the amplitude modulation circuit 100 and to further enhance stability of the linear operation in amplitude modulation. A plurality of automatic gain control circuits may be provided.

What is claimed is:

1. An amplitude modulation circuit comprising:
   a first input terminal;
   a second input terminal;
   a third input terminal;
   a first output terminal;
   a second output terminal;
   a current source;
   a first transistor including a control terminal, a first current terminal, and a second current terminal, the control terminal being connected to the first input terminal, the first current terminal being electrically connected to the first output terminal, and the second current terminal being electrically connected to a first power line via the current source;
   a second transistor including a control terminal, a first current terminal, and a second current terminal, the control terminal of the second transistor being connected to the second input terminal, the first current terminal of the second transistor being electrically connected to the second output terminal, and the second current terminal of the second transistor being electrically connected to the second current terminal of the first transistor and electrically connected to the first power line via the current source;
   a first resistive element electrically connected between the first output terminal and a second power line;
   a second resistive element electrically connected between the second output terminal and the second power line; and
   a first Metal-Oxide-Semiconductor (MOS) transistor including a first terminal, a second terminal, and a control terminal, the first terminal being connected to the first output terminal, the second terminal being connected to the second output terminal, and the control terminal being connected to the third input terminal, the first MOS transistor being configured to operate in a non-saturated region, the first MOS transistor having a resistance between the first terminal and second terminal, the resistance being larger than a resistance of the first resistive element, and larger than a resistance of the second resistive element.

2. The amplitude modulation circuit according to claim 1, further comprising:

an intermediate potential generator circuit configured to apply an intermediate potential between a potential of the first output terminal and a potential of the second output terminal to a back gate of the first MOS transistor;

a bias voltage generator circuit configured to generate a bias voltage with the intermediate potential as a reference; and a superimposition circuit configured to modulate an amplitude of the bias voltage using a sub-signal to provide an amplitude-modulated bias voltage and apply the amplitude-modulated bias voltage to the control terminal of the first MOS transistor.

3. The amplitude modulation circuit according to claim 2, wherein the intermediate potential generator circuit includes a series resistor circuit connected between the first output terminal and the second output terminal and is configured to generate the intermediate potential.

4. The amplitude modulation circuit according to claim 2, wherein the bias voltage generator circuit includes:

a second MOS transistor including a first terminal, a second terminal, and a control terminal connected to the first terminal of the second MOS transistor; and a current source connected to an output of the intermediate potential generator circuit via the second MOS transistor.

5. The amplitude modulation circuit according to claim 2, wherein the superimposition circuit includes:

a capacitor connected between the third input terminal and the control terminal of the first MOS transistor; and a resistive element connected between an output of the bias voltage generator circuit and the control terminal of the first MOS transistor.

6. The amplitude modulation circuit according to claim 1, wherein a change in voltage between the first terminal and the second terminal of the first MOS transistor caused by a sub-signal is smaller than a change in voltage of the control terminal of the first MOS transistor caused by the sub-signal.

7. The amplitude modulation circuit according to claim 6, wherein the change in voltage between the first terminal and the second terminal of the first MOS transistor caused by the sub-signal is equal to or less than one fifth of the change in voltage of the control terminal of the first MOS transistor caused by the sub-signal.

8. The amplitude modulation circuit according to claim 1, wherein a Nyquist frequency of a main signal is equal to or more than 1000 times a main frequency of a sub-signal.

9. A semiconductor integrated circuit comprising:

the amplitude modulation circuit according to claim 1; and an amplifier circuit connected to the amplitude modulation circuit in a cascade manner.

10. The semiconductor integrated circuit according to claim 9, further comprising an automatic gain control circuit configured to detect an amplitude of an amplitude-modulated component using a sub-signal output from the first output terminal and the second output terminal and to adjust a gain of the amplitude modulation circuit based on the amplitude.

* * * * *